United States Patent
De Poorter et al.

[11] Patent Number: 5,289,483
[45] Date of Patent: Feb. 22, 1994

[54] SEMICONDUCTOR DEVICE HAVING A MESA AND METHOD OF MANUFACTURING SAME

[75] Inventors: Johannes A. De Poorter; Adriaan Valster, both of Eindhoven, Netherlands

[73] Assignee: U.S. Philips Corp., New York, N.Y.

[21] Appl. No.: 883,758

[22] Filed: May 15, 1992

[30] Foreign Application Priority Data

May 16, 1991 [EP] European Pat. Off. ......... 91107902.8

[51] Int. Cl.$^5$ ................................................. H01S 3/19
[52] U.S. Cl. ...................................... 372/45; 372/48; 372/46
[58] Field of Search ................ 372/45, 46; 11/48, 43

[56] References Cited

FOREIGN PATENT DOCUMENTS 0052984 3/1987 Japan ................................ 372/48

OTHER PUBLICATIONS

"New Stripe Geometry Laser With Simplified Fabrication Process' Electron". Lett. vol. 15, No. 14, Jul. 5, 1979, pp. 441-442.

*Primary Examiner*—Georgia Y. Epps
*Attorney, Agent, or Firm*—Steven R. Biren

[57] ABSTRACT

A semiconductor device includes a semiconductor structure (D3) of parallel semiconductor layers on a semiconductor substrate (1), in which layers a mesa (12) is formed which includes only a portion (D1) of the semiconductor layer structure (D3). Such devices as are useful in optoelectronic devices in which the mesa (12) forms part of a semiconductor diode laser or a radiation waveguide. During cleaving of such devices, for example for the formation of a mirror surface, damage often arises near the mesa (12), which is undesirable. The mesa (12), which projects from the device, is also easily damaged during further manipulation of the device. The semiconductor layer structure (D3) includes a sunken region (11) within which the semiconductor layer structure (D3) is at least partly recessed in the substrate (1), while the mesa (12) is positioned within the boundaries of the sunken region (11). As a result, the mesa (12) is also recessed at least partly, and thus is at least partly protected. In addition, less damage occurs near the mesa (12) during cleaving. When the mesa (12) is entirely recessed, the device is in addition particularly suitable for upside-down final mounting. In a method of making the device, a recess (11) is provided in the substrate (1) before the semiconductor layer structure (D3) and the mesa (12) therein are provided. This method is very simple and gives a high yield of devices having the required characteristics.

10 Claims, 1 Drawing Sheet

SEMICONDUCTOR DEVICE HAVING A MESA AND METHOD OF MANUFACTURING SAME

BACKGROUND OF THE INVENTION

The invention relates to a semiconductor device comprising a semiconductor body with a semiconductor substrate on which a semiconductor layer structure of mutually substantially parallel semiconductor layers is provided, at the surface of which a mesa is formed which comprises only a portion, called first portion, of the semiconductor structure, while a portion of the semiconductor structure called second portion not forming part of the mesa is situated below and on either side of the mesa. The invention also relates to a method of manufacturing a semiconductor device of the kind mentioned above.

Such semiconductor devices are frequently used inter alia in optoelectronic devices in which the mesa forms part of, for example, a semiconductor diode laser, a radiation waveguide, or a photodiode, and which find their application in, for example, optical disc systems or bar code readers.

Such a semiconductor device is known from the article by M. C. Amann, "New Stripe-Geometry Laser with Simplified Fabrication Process" published in Electron. Lett. vol. 15, no. 14, Jul. 5, 1979, pp. 441–442. The known semiconductor device comprises a semiconductor diode laser of the so-called ridge waveguide type, in which a semiconductor layer structure is provided on an n-GaAs substrate, which structure has at its surface a strip-shaped mesa which comprises the first portion of the semiconductor layer structure, here a p-GaAs layer and part of a p-AlGaAs cladding layer, while the second portion of the semiconductor layer structure extending below and next to the mesa comprises an n-GaAs buffer layer, another n-AlGaAs cladding layer, a GaAs active layer, and the remaining part of the p-AlGaAs buffer layer. The upper and lower sides of the semiconductor device are provided with conductive layers. Such a semiconductor device has many advantages such as a simple manufacture, simple contacting, and low contact resistance.

A disadvantage of the known semiconductor device is that the mesa, which projects from the semiconductor body, is comparatively vulnerable, especially when one of its lateral dimensions is comparatively small, as is the case in a diode laser. Another disadvantage of the known semiconductor device is that unevennesses on the cleaving face, so-called cleavage steps, are formed in the vicinity of, often just below the mesa during cleaving of this semiconductor device, which is especially undesirable in an optoelectronic semiconductor device.

SUMMARY OF THE INVENTION

The invention has for its object inter alia to provide a semiconductor device in which the above disadvantages are completely or at least partly eliminated. The invention also has for its object to provide a simple method of manufacturing such a semiconductor device.

A semiconductor device of the kind mentioned above is for this purpose characterized in that the semiconductor layer structure comprises a sunken region within which the semiconductor layer structure is at least partly recessed into the substrate and within which the mesa is situated. In such a semiconductor device, the second portion of the semiconductor layer structure is at a higher level outside the region where the semiconductor layer structure is partly recessed than inside this region. The mesa-shaped elevations thus formed on either side of the mesa form a protection against damage of the mesa owing to the smaller difference in height with the mesa. It has also been found that substantially fewer cleavage steps, i.e. damage or irregularities at a cleaving surface, occur during cleaving of the device according to the invention, at least in the immediate vicinity of the mesa.

In an important embodiment, the semiconductor layer structure in the sunken region is at least so far recessed into the semiconductor substrate that the upper side of the mesa lies at or below the upper surface of the semiconductor body. This has the major advantage that the semiconductor device is highly suitable for upside-down mounting, whereby the side of the semiconductor body where the mesa is situated rests on a flat carrier such as a lead frame, printed-circuit board, or heat sink. The device in that case rests mainly or entirely on the second portion of the semiconductor layer structure instead of on the mesa.

A further embodiment of a device according to the invention is characterized in that the semiconductor layer structure runs substantially parallel to the substrate at the area of the mesa and in that the second portion of the semiconductor layer structure outside the mesa is partly recessed into the substrate over a distance to the mesa which is at least equal to the thickness of the semiconductor layer structure. A substantially plane layer structure at the area of the mesa is desirable for many applications, for example, for semiconductor devices with diode lasers. To obtain such a semiconductor layer structure which is parallel to the substrate, it is necessary for the second portion of the semiconductor layer structure outside the mesa to be partly recessed into the substrate over a distance to the mesa which is at least equal to the thickness of the semiconductor layer structure, as will become apparent in the discussion of a method according to the invention. Moving from the edge of the mesa to the edge of the recessed region, the second portion of the semiconductor layer structure preferably shows a gradual and fluently decreasing degree of recessing. This is especially advantageous if a further layer is provided over the semiconductor device. In a preferred modification, a conductive layer extends over the mesa and the upper side of the second portion of the semiconductor layer structure. When the upper layer of the second portion of the semiconductor layer structure comprises a suitable material, for example, a semiconductor material having a higher band gap than the material of the upper semiconductor layer in the mesa, the conductive layer upon connection in the forward-bias direction forms a current-limiting barrier with the second portion of the semiconductor layer structure, whereas a good current conduction through the semiconductor layer structure obtains at the area of the mesa. The portion of the conductive layer situated on the second portion of the semiconductor layer structure is highly suitable for contacting, either through wire bonding or through gluing, formation of an alloy, and the like in the case of upside-down mounting A preferred embodiment of a device according to the invention is characterized in that the semiconductor body comprises a semiconductor diode laser, the semiconductor substrate is of a first conductivity type and is provided at the lower side with a first conductive layer, the semiconductor layer structure consecutively comprises at least a first cladding layer of the first conductivity type, an active layer, a second cladding layer of a second conductivity type opposed to the first, and a contact layer of the second conductivity type which is provided with a second conductive layer, while the first portion of the semiconductor layer structure comprises at least the contact layer and the second portion of the semiconductor layer structure comprises the first cladding layer, the active layer, and at least a portion of the second cladding layer, and the second conductive layer extends over the mesa and over the second portion of the semiconductor layer structure. In such a semiconductor device according to the invention, the current runs mainly through the mesa upon connection in the forward-bias direction. In addition, such a device is particularly easy to manufacture and has very favorable characteristics such as a low starting current of the diode laser. The semiconductor diode lasers may be of the gain-guided as well as of the index-guided type. The mesa, and consequently the first portion of the semiconductor layer structure, in the former case comprises the contact layer and at most a small portion of the second cladding layer, whereas in the latter case it comprises the contact layer and the major portion of the second cladding layer. Semiconductor devices with semiconductor diode lasers of the index-guided type form a preferred modification of this embodiment, since the mesa is comparatively high, and thus particularly vulnerable, in these lasers.

A method of manufacturing a semiconductor device according to which semiconductor layer structure of substantially parallel semiconductor layers is provided on a semiconductor substrate, upon which a mesa is formed therein which comprises only a portion, called first portion, of the semiconductor layer structure, is according to the invention characterized in that before the provision of the semiconductor layer structure a recess is locally provided in the substrate, the semiconductor layer structure is provided so as to extend over the recess and the adjoining portions of the surface of the substrate, and in that the mesa is provided within the recess in the substrate seen in plan view. An important advantage of the method according to the invention is that it comprises only a single deposition step in which semiconductor layers are provided. Not only does this render the method very simple, but semiconductor devices according to the invention are also obtained with a high yield. Preferably, the depth of the recess and the thickness of the second portion of the semiconductor layer structure are so chosen that the sum of these thicknesses is at least substantially equal to the thickness of the semiconductor layer structure. As a result, the method according to the invention leads to substantially plane semiconductor devices which are particularly suitable for upside-down mounting. Preferably, furthermore, the distance between the edge of the recess and the edge of the mesa is chosen to be at least equal to the thickness of the semiconductor layer structure. Devices may be obtained by this in which the mesa is substantially plane. The degree of recessing of the semiconductor layer structure is preferably chosen to be gradually decreasing away from the mesa towards the edge of the recess. This may be realized through the use of suitable etchants during the formation of the recess and, for example, through the use of underetching during the formation of the recess in the substrate.

An important embodiment of a method according to the invention whereby a semiconductor diode laser is formed in the semiconductor body is characterized in that, after the formation of the recess in the substrate which is of a first conductivity type, the following are provided in that order: a first cladding layer of the first conductivity type, an active layer, a second cladding layer of a second conductivity type opposed to the first, and a contact layer of the second conductivity type, after which the mesa is formed through local removal of at least the contact layer, upon which the upper side and the lower side of the semiconductor layer are provided with a conductive layer. Semiconductor devices are obtained by such a method which are particularly suitable for use in optoelectronic devices including the optical disc systems and bar code readers envisaged here.

BRIEF DESCRIPTION OF THE DRAWING

The invention will now be explained in more detail with reference to an embodiment and the accompanying drawing, in which.

Figure 1:
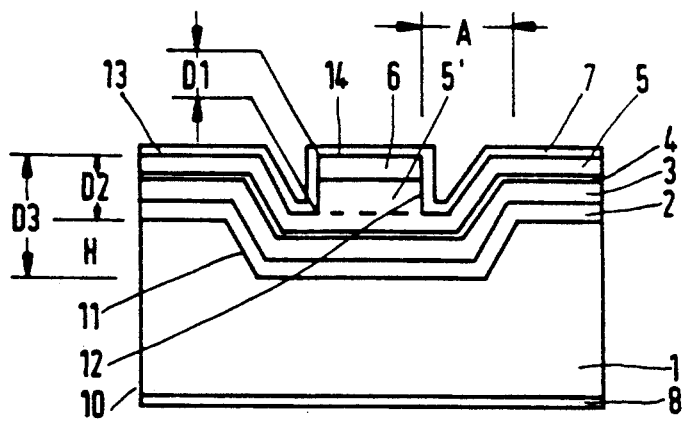
FIG. 1 diagrammatically shows an embodiment of a semiconductor device according to the invention with a semiconductor diode laser in cross-section.

The Figures are diagrammatic and not drawn to scale, the dimensions in the thickness direction being particularly exaggerated for greater clarity. Corresponding parts in the various Figures are usually given the same reference numerals. Semiconductor regions of the same conductivity type are usually hatched in the same direction, if applicable.

DESCRIPTION OF THE PREFERRED EMBODIMENTS

FIG. 1 diagrammatically shows in cross-section substantially perpendicular to the longitudinal direction an embodiment of a semiconductor device according to the invention comprising a semiconductor diode laser of the ridge waveguide type. The device comprises a semiconductor body 10 with a substrate 1 of a first, here the n-conductivity type and made of monocrystalline gallium arsenide in this example, which substrate is provided with a connection conductor 8, here of Au-Ge-Ni. A semiconductor layer structure D3 is provided thereon consisting of mutually substantially parallel semiconductor layers, here comprising in that order a buffer layer 2, a first cladding layer 3, an active layer 4, a second cladding layer 5, 5', and a contact layer 6. The following compositions, conductivity types, doping concentrations, and thicknesses were used for the various semiconductor layers in the present example.

| Layer | Semiconductor | Type | Doping conc. (at/cm$^3$) | Thickness ($\mu$m) |
| --- | --- | --- | --- | --- |
| 1 | GaAs | N | $2 \times 10^{18}$ | 100 |
| 2 | GaAs | N | $2 \times 10^{18}$ | 0.4 |
| 3 | Al$_{0.4}$Ga$_{0.6}$As | N | $1 \times 10^{18}$ | 1.2 |
| 4 | Al$_{0.1}$Ga$_{0.9}$As | — | — | 0.2 |
| 5 | Al$_{0.4}$Ga$_{0.6}$As | P | $5 \times 10^{17}$ | 0.4 |
| 5' | Al$_{0.4}$Ga$_{0.6}$As | P | $5 \times 10^{17}$ | 1.1 |
| 6 | GaAs | P | $5 \times 10^{18}$ | 1.0 |
| 7 | Ti—Pt—Au | | | 0.1 |

-continued

| Layer | Semiconductor | Type | Doping conc. (at/cm³) | Thickness (μm) |
|-------|---------------|------|----------------------|----------------|
| 8     | Au—Ge—Ni      |      |                      | 0.1            |

The buffer layer 2 present in this example is by no means necessary, but it is frequently used in devices of III-V semiconductor materials. A mesa 12, which is strip-shaped here, is formed at the surface 13, 14 of the semiconductor layer structure D3, which mesa comprises only a portion D1, called first portion, of the semiconductor layer structure D3, in this example the contact layer 6 and a portion 5' of the second cladding layer 5, 5'. A portion D2 of the semiconductor layer structure D3 not forming part of the mesa 12, called second portion and comprising in this example the buffer layer 2, the first cladding layer 3, the active layer 4 and a portion 5 of the second cladding layer 5, 5' extends below and on either side of the mesa 12. According to the invention, the semiconductor layer structure D3 comprises a sunken region 11 within which the semiconductor layer structure D3 is recessed into the substrate 1 at least for a part, here comprising the second portion D2 of the semiconductor layer structure, the mesa 12 lying inside the sunken region 11. The second portion D2 of the semiconductor layer structure D3 outside the sunken region 11 forms an elevation which protects the mesa 12 against damage, since this mesa in the device according to the invention projects less far upward from the semiconductor body 10, or even does not project at all, as in the present example. It is also surprisingly found that fewer cleavage steps arise, at least in the vicinity of the mesa 12, when the device is cleaved so as to form a mirror surface: in FIG. 1 the plane of the drawing forms a cleavage surface of the device in this embodiment acting as a mirror surface of the diode laser. Preferably, as in the present example, the semiconductor layer structure D3 is at least so far recessed into the sunken region 11 that the upper side 14 of the mesa 12 lies in or below, in this example approximately 0.2 μm below, the upper surface 13 of the semiconductor body 10. As a result, the device according to this example is particularly suitable for upside-down mounting. Preferably, the spacing A between the edge of the mesa 12 and the edge of the sunken region 11, here 5 μm, is at least equal to the thickness of the semiconductor layer structure D3, here 4.3 μm, so that the mesa 12 lies in a substantially plane portion of the semiconductor layer structure D3, as in the present example. Also, as in the present example, the second portion D2 of the semiconductor layer structure D3 may have a partial and fluently decreasing recessing into the substrate 1 from the mesa 12 towards the edge of the sunken region 11, so that the second portion D2 is satisfactorily covered near the edge of the sunken region by a further layer provided over the semiconductor body, in this case a conductive layer 7 comprising Ti-Pt-Au in the present example. The conductive layer 7 forms a current-limiting barrier with the second portion D2, whose upper side is formed by a portion 5 of the second cladding layer 5, 5' comprising AlGaAs, and forms a well-conducting junction with the contact layer 6 which forms part of the mesa 12 and comprises GaAs. Such a device has the advantage that the current will flow substantially exclusively through the mesa 12 in the case of a forward bias across the conductive layers 7 and 8, so that in this example the diode laser of which the mesa 12 forms part has a particularly low starting current and is easy to manufacture, since no masking step is necessary for forming the contact with the mesa 12 by means of the conductive layer 7. The width of the mesa in this example is 4 μm, that of the sunken region 11 approximately 14 μm, while both have a length of approximately 300 μm.

Figure 2:
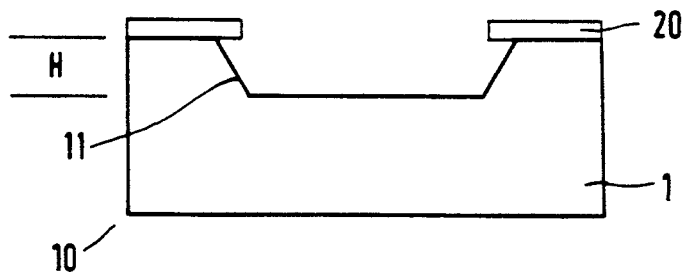
FIGS. 2 to 4 diagrammatically show the semiconductor device of FIG. 1 in cross-section in consecutive stages of manufacture by a method according to the invention.
Figure 3:
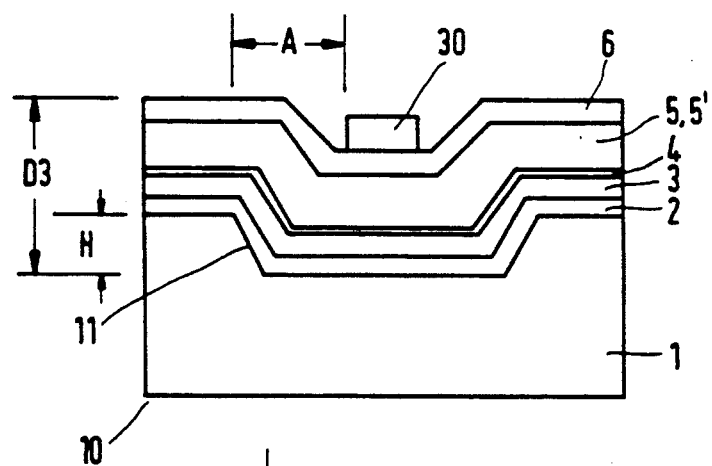
Figure 4:
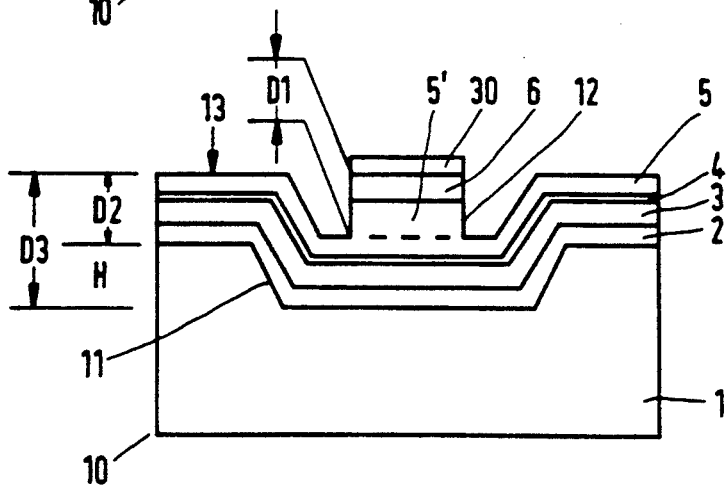

The semiconductor device described is manufactured as follows according to the invention (see FIGS. 2 to 4). The starting point is a substrate 1 of monocrystalline n-type gallium arsenide. A masking layer 20 of, for example, silicon dioxide is provided thereon (see FIG. 2), for example, by means of sputtering, in which layer a strip-shaped opening with a width of approximately 14 μm is provided by means of photolithography. Subsequently, according to the invention, a recess 11, strip-shaped in this case, with a depth H, approximately 2.2 μm in this example, and with a width of approximately 14 μm is formed in the semiconductor substrate 1, for example by means of etching with a solution of ammonia and hydrogen peroxide. After the masking layer 20 has been removed and the semiconductor body 10 has been cleaved in usual manner, the latter is put in a growing device, for example, an OMVPE (=Organo Metallic Vapor Phase Epitaxy) growing device. Subsequently (see FIG. 3), a semiconductor layer structure D3 of substantially parallel semiconductor layers is provided, comprising in that order a buffer layer 2, a first cladding layer 3, an active layer 4, a second cladding layer 5, 5', and a contact layer 6. Semiconductor material, conductivity type, doping concentration, and thickness of the various semiconductor layers are chosen as indicated above in the Table.

After the semiconductor body 10 has been removed from the growing device, a strip-shaped mask 30 with a width of approximately 4 μm is provided on the semiconductor layer structure D3 in a manner similar to the one described with reference to FIG. 2. Then (see FIG. 4) a strip-shaped mesa 12 is formed by means of, for example, RIE (=Reactive Ion Etching) in that the contact layer 6 and a portion 5' of the second cladding layer 5, 5' are removed outside the mask 30, which corresponds to a portion D1 of the semiconductor layer structure D3. A second portion D2 of the semiconductor layer structure D3 is formed hereby on either side of the mesa 12, in this example comprising the buffer layer 2, the first cladding layer 3, the active layer 4, and a portion 5 of the second cladding layer 5, 5'. Preferably, the depth of the recess H in this example becomes approximately 2.2 μm, and the thickness of the second portion D2 also becomes approximately 2.2 μm in this example, so that the sum of these thicknesses, here approximately 4.4 μm, is at least equal to, here approximately 0.1 μm greater than the thickness of the semiconductor layer structure D3, here approximately 4.4 μm, so that the mesa 12 is at least, here exactly, recessed into the semiconductor body 10. Preferably, also, the spacing A between the edges of the mesa 12 and the recess 11, here approximately 5 μm, is chosen to be at least equal to, here approximately 0.7 μm greater than the thickness of the semiconductor layer structure D3, which is approximately 4.3 μm thick here. As a result, the mesa 12 is formed in a substantially plane portion of the semiconductor layer structure D3. The recess 11 is preferably provided with sloping side surfaces to allow the portion D2 to have a fluent and gradual decrease in recessing when leaving the sunken region 11. This may be readily achieved through a suitable choice of etchants and etching techniques. After the removal of the mask 30 and bulk reduction through grinding of the substrate down to approximately 100 μm and the provision of a conductive layer 8 (see FIG. 1) on the lower side of the substrate 1, the semiconductor body 10 is coated with a conductive layer 7 at the upper side and a semiconductor device according to the invention is obtained after cleaving and breaking. The conductive layer 7 forms a current-limiting barrier together with the portion D2 outside the mesa 12, and a highly-conductive junction (see FIG. 1) with the contact layer 6 at the area of the mesa 12. As a result, the diode laser of the semiconductor device according to the invention and the present example has a particularly low starting current. The method according to the invention has the major advantage that it is very simple, inter alia because of the use of only a single growing step and because of the fact that the conductive layers 7, 8 need not be patterned. Owing to these and other factors, devices according to the invention with a particularly high yield are obtained by the method according to the invention.

The invention is not limited to the embodiment given, since many modifications and variations are possible to those skilled in the art within the scope of the invention. Thus other semiconductor materials or other compositions than those mentioned in the example may be used. When semiconductor materials from the GaAs/AlGaAs system are chosen for the substrate and the semiconductor layers, devices are created which may be used in the wavelength range of approximately 0.7 to 0.9 μm. Semiconductor materials of the InGaP/InAlGaP system are chosen, for example, when the wavelength range of approximately 0.5 to 0.7 μm is desired, and semiconductor materials from InP/InGaAsP material system for the wavelength range of 1 to 1.5 μm. The conductivity types may also all be replaced (simultaneously) by their opposites. The semiconductor device may comprise besides diode lasers of the index-guided type also diode lasers of the gain-guided type. The invention is not limited to semiconductor devices with diode lasers. Devices with radiation waveguides or photodiodes may also be used. The invention is not even limited to optoelectronic semiconductor devices since, for example, devices may be used comprising, for example, transistors having mesas. A relative elevation of the situation of a portion of the semiconductor layer structure next to the mesa and the fact that the upper semiconductor layer in the mesa has different characteristics from those of the upper semiconductor layer of adjoining portions of the semiconductor layer structure may also be advantageously utilized in mesas of this kind. This advantage becomes apparent when a further semiconductor layer or conductive layer is provided over the structure.

We claim:

1. A semiconductor device comprising a semiconductor body with a semiconductor substrate on which a semiconductor layer structure of mutually substantially parallel semiconductor layers is provided, at the surface of which a mesa is formed which comprises only a first portion, of the semiconductor structure, while a second portion of the semiconductor structure not forming part of the mesa is situated below and on either side of the mesa, characterized in that the semiconductor layer structure comprises a sunken region within which the semiconductor layer structure is at least partly recessed into the substrate and within which the mesa is situated.

2. A semiconductor device as claimed in claim 1, characterized in that the semiconductor layer structure in the sunken region is at least so far recessed into the semiconductor substrate that the upper side of the mesa lies at or below the upper surface of the semiconductor body.

3. A semiconductor device as claimed in claim 1, characterized in that the semiconductor layer structure runs substantially parallel to the substrate at the area of the mesa and in that the second portion of the semiconductor layer structure outside the mesa is partly recessed into the substrate over a distance to the mesa which is at least equal to the thickness of the semiconductor layer structure.

4. A semiconductor device as claimed in claim 1, characterized in that a further layer is present over the upper side of the semiconductor body.

5. A semiconductor device as claimed in claim 1, characterized in that the semiconductor body comprises a semiconductor diode laser, the semiconductor substrate is of a first conductivity type and is provided at the lower side with a first conductive layer, the semiconductor layer structure consecutively comprises at least a first cladding layer of the first conductivity type, an active layer, a second cladding layer of a second conductivity type opposed to the first, and a contact layer of the second conductivity type which is provided with a second conductive layer, while the first portion of the semiconductor layer structure comprises at least the contact layer and the second portion of the semiconductor layer structure comprises the first cladding layer, the active layer, and at least a portion of the second cladding layer, and the second conductive layer extends over the mesa and over the second portion of the semiconductor layer structure.

6. A semiconductor device as claimed in claim 5, characterized in that the first portion of the semiconductor layer structure comprises the contact layer and the major portion of the second cladding layer, and the second portion of the semiconductor layer structure comprises the first cladding layer, the active layer, and a small portion of the second cladding layer.

7. A method of manufacturing a semiconductor device, whereby a semiconductor layer structure of substantially parallel semiconductor layers is provided on a semiconductor substrate, in which structure a mesa is formed which comprises only a first portion of the semiconductor layer structure, characterized in that before the provision of the semiconductor layer structure a recess is locally provided in the substrate, in that the semiconductor layer structure is provided so as to extend over the recess and the adjoining portions of the surface of the substrate, and in that the mesa is provided within the recess in the substrate.

8. A method as claimed in claim 7, characterized in that the depth of the recess and the thickness of the second portion of the semiconductor layer structure are so chosen that the sum of these thicknesses is at least substantially equal to the thickness of the semiconductor layer structure.

9. A method as claimed in claim 7, characterized in that the distance between the edge of the recess and the edge of the mesa is chosen to be at least equal to the thickness of the semiconductor layer structure.

10. A method as claimed in claim 7, whereby a semiconductor diode laser is formed in the semiconductor body, characterized in that, after the formation of the recess in the substrate which is of a first conductivity type, the following are provided in that order: a first cladding layer of the first conductivity type, an active layer, a second cladding layer of a second conductivity type opposed to the first, and a contact layer of the second conductivity type, after which the mesa is formed through local removal of at least the contact layer, and the upper side and the lower side of the semiconductor layer are provided with a conductive layer.

* * * * *